United States Patent
Jensen et al.

(10) Patent No.: US 6,349,043 B1
(45) Date of Patent: Feb. 19, 2002

(54) APPARATUS FOR REDUCING ELECTROMAGNETIC EMISSIONS

(75) Inventors: Ralph Warren Jensen; Richard Steven Mills; David Mark Wilcox, all of Austin; Tracey Wade Kannmacher, Lago Vista, all of TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 09/599,288

(22) Filed: Jun. 21, 2000

(51) Int. Cl.⁷ .................................................. H05K 9/00
(52) U.S. Cl. ....................... 361/818; 361/799; 361/800; 361/801; 361/816; 174/35 R; 24/563
(58) Field of Search .................................. 361/752, 753, 361/799, 816, 818, 800, 801, 802, 803; 174/35 R, 35 GC, 51; 24/563

(56) References Cited

U.S. PATENT DOCUMENTS

| | | |
|---|---|---|
| 4,115,655 A | 9/1978 | Prentice |
| 4,745,524 A | 5/1988 | Patton, III |
| 4,780,570 A | 10/1988 | Chuck |
| 5,308,251 A | 5/1994 | Kaufman et al. |
| 5,490,043 A | 2/1996 | Tan et al. |
| 5,502,620 A | 3/1996 | Funck et al. |
| 5,532,428 A | 7/1996 | Radloff et al. |
| 5,563,450 A | 10/1996 | Bader et al. |
| 5,647,748 A | 7/1997 | Mills et al. |
| 5,650,922 A * | 7/1997 | Ho ............................. 361/799 |
| 5,653,596 A | 8/1997 | Banakis et al. |
| 5,774,330 A | 6/1998 | Melton et al. |
| 6,008,994 A | 12/1999 | Bates |
| 6,058,025 A * | 5/2000 | Ecker et al. ................. 361/816 |

* cited by examiner

*Primary Examiner*—Jayprakash N. Gandhi
(74) *Attorney, Agent, or Firm*—Haynes and Boone, LLP

(57) ABSTRACT

A computer system including a chassis having a microprocessor mounted thereon. A system memory is coupled to provide storage to facilitate execution of computer programs by the microprocessor. An input is coupled to provide input to the microprocessor and a display is coupled to the microprocessor by a video controller. A mass storage is coupled to the microprocessor. A shielding body is mounted on the chassis. A pair of spaced apart contact members are attached to the shielding body. A main spring member is attached to at least one of the contact members. The main spring member includes an elongated beam offset from the contact members and a plurality of spring fingers interconnecting the beam and at least one of the contact members.

23 Claims, 6 Drawing Sheets

APPARATUS FOR REDUCING ELECTROMAGNETIC EMISSIONS

BACKGROUND

The disclosures herein relate generally to computer systems and more particularly to a shielding apparatus for reducing electromagnetic emissions from a computer system.

In order to meet electromagnetic emissions regulations required by agencies such as the Federal Communication Commission (FCC), it is common practice to place a compliant and conductive shielding device between an expansion device of a computer and the computer chassis. The shielding device provides a ground path between the chassis and the expansion device to aid in containing electromagnetic emissions within the chassis.

U.S. Pat. No. 5,653,396 discloses a grounding system for an electrical connector assembly which provides an interconnection between a PC card and a main printed circuit board. A header connector is mounted on the main printed circuit board and receives the PC card. Mating terminals are provided on the header connector and a receptacle connector on the PC card for interconnection of the PC card to electrical circuit traces on the main printed circuit board. At least one header grounding contact is mounted on the header connector adjacent to, but spaced apart from, the terminals and is coupled to a logic ground circuit on the main printed circuit board. A card grounding contact is mounted on the PC card near the front insertion end thereof for engaging the header grounding contact and for connecting the logic ground circuit of the main printed circuit board to a logic ground circuit on the PC card to provide a low impedance ground return.

U.S. Pat. No. 5,596,170 discloses a flexible electrical contact having a convex dome structure extending from one side of a surrounding structure. The convex dome structure and the surrounding structure form an integral metallic structure. The convex dome structure includes a central contact portion and a number of legs extending between the central contact portion and the surrounding structure. Each leg extends radially outward from the central contact portion and circumferentially around part of the central contact portion.

U.S. Pat. No. 5,563,450 discloses a peripheral card including a two-part metal cover mounting a printed wiring board on a U-shaped plastic frame. The wiring board is spaced from inside surfaces of the cover preferably by a pair of spring clips mountable on side edges of the wiring board. Each spring clip has an apertured if intermediate bight portion overlying, and in scraped contact with, ground contact pads on the board. Barbed-end spring fingers extend integrally from the bight portion preferably toward the board side edge to which it is affixed. The fingers are in scraped contact with respective ones of the metal cover parts as the metal cover parts are assembled together. The clips hold the board from movement in the cover and electrically ground any static electrical charges on the metal cover parts to the contact pads and to a ground socket in the frame. The clips electrically ground the metal cover parts to provide electromagnetic shielding of the electrical circuitry on the wiring board.

U.S. Pat. No. 4,780,570 discloses an electromagnetic interference (EMI) shield for situations which require heavy-duty wiping insertions, such as when a relatively heavy electronic assembly is to be removably inserted in a cabinet. Integral EMI strips of conductive spring material are riveted to opposite cabinet walls so as to be adjacent the wiping sides of the inserted electronic assembly. Each EMI strip contains integral longitudinally spaced projecting fingers formed to provide durable and highly reliable EMI shielding capable of withstanding many insertions and removals.

A common commercially-implemented shielding device for use with expansion devices in a computer includes a metal shield with a plurality of compliant spring members. Such expansion devices may include, for example, memory cards, sound cards, etc. The spring members extend from a surface of the shielding device and include free ends for engaged the expansion device. The shielding device is positioned between the expansion device and the chassis. The ground path is created by the compliant spring members engaging against the expansion device and the shielding device being engaged against, or being attached to, the chassis.

Shielding devices of this type are known to have a number of undesirable characteristics. First, these types of shielding devices are easily damaged as a result of one or more of the free ends getting caught in the expansion devices during either removal or insertion of the expansion devices into the chassis. This results in the spring members being distorted, broken or otherwise disabled. Second, to ensure sufficient grounding performance and reliability, it is common for the shielding device to include a plurality of spring members. This increases the likelihood of one or more of the spring members being damaged. The use of a plurality of spring members significantly increases the forces associated with deflecting the spring members. With sufficient force, the chassis can be distorted. The distortion may result in the shielding device interfering with cables being connected to the expansion cards in configurations where a cable connector is connected to the expansion device through an access opening extending through the shielding device. The distortion often results in a breach in EMI protection, allowing electromagnetic emissions to be radiated from the chassis.

A preferred material for shielding devices is a high performance material such as tin-plated beryllium copper. Beryllium copper offers exceptional resiliency as compared to low performance materials such as cold-rolled, low-carbon sheet metal. However, high performance materials are significantly more expensive than low performance materials. In cost sensitive applications, the relatively high cost of high performance materials precludes their use as the material for the shielding device.

Therefore, what is needed is a robust EMI shielding apparatus that reduces the potential for electromagnetic emissions from a chassis of an electronic device, that reduces the potential of damage to the shielding apparatus, chassis or expansion device during insertion and withdrawal of the expansion device and that is made of a low-cost material exhibiting less than preferred flexural characteristics.

SUMMARY

Accordingly, in one embodiment, an electromagnetic shielding device uses physical configurations of structural elements to provide desired flexural characteristics. To this end, an apparatus for reducing electromagnetic emissions includes a shielding body and a pair of spaced apart contact members attached to the shielding body. A main spring member is attached to at least one of the contact members. The main spring member includes an elongated beam offset from the contact members and a plurality of spring fingers interconnecting the beam and at least one of the contact members.

A principal advantage of this embodiment is that the apparatus may be made from a low-cost material that exhibits less than preferred flexural properties.

BRIEF DESCRIPTION OF THE DRAWING FIGURES

DETAILED DESCRIPTION

Figure 1:
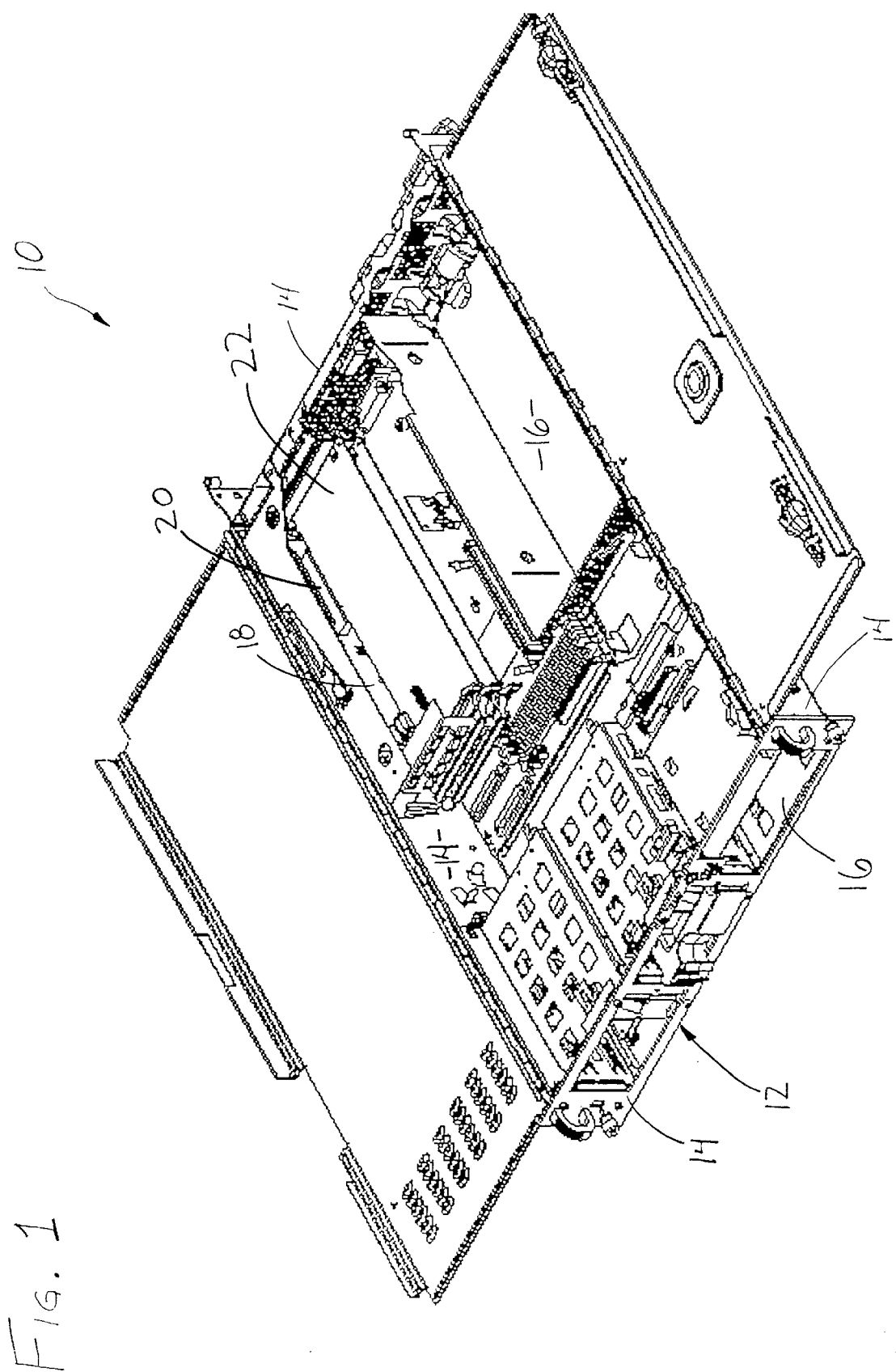
FIG. 1 is a perspective view illustrating an embodiment of an electronic apparatus having an expansion device mounted therein.
Figure 2:
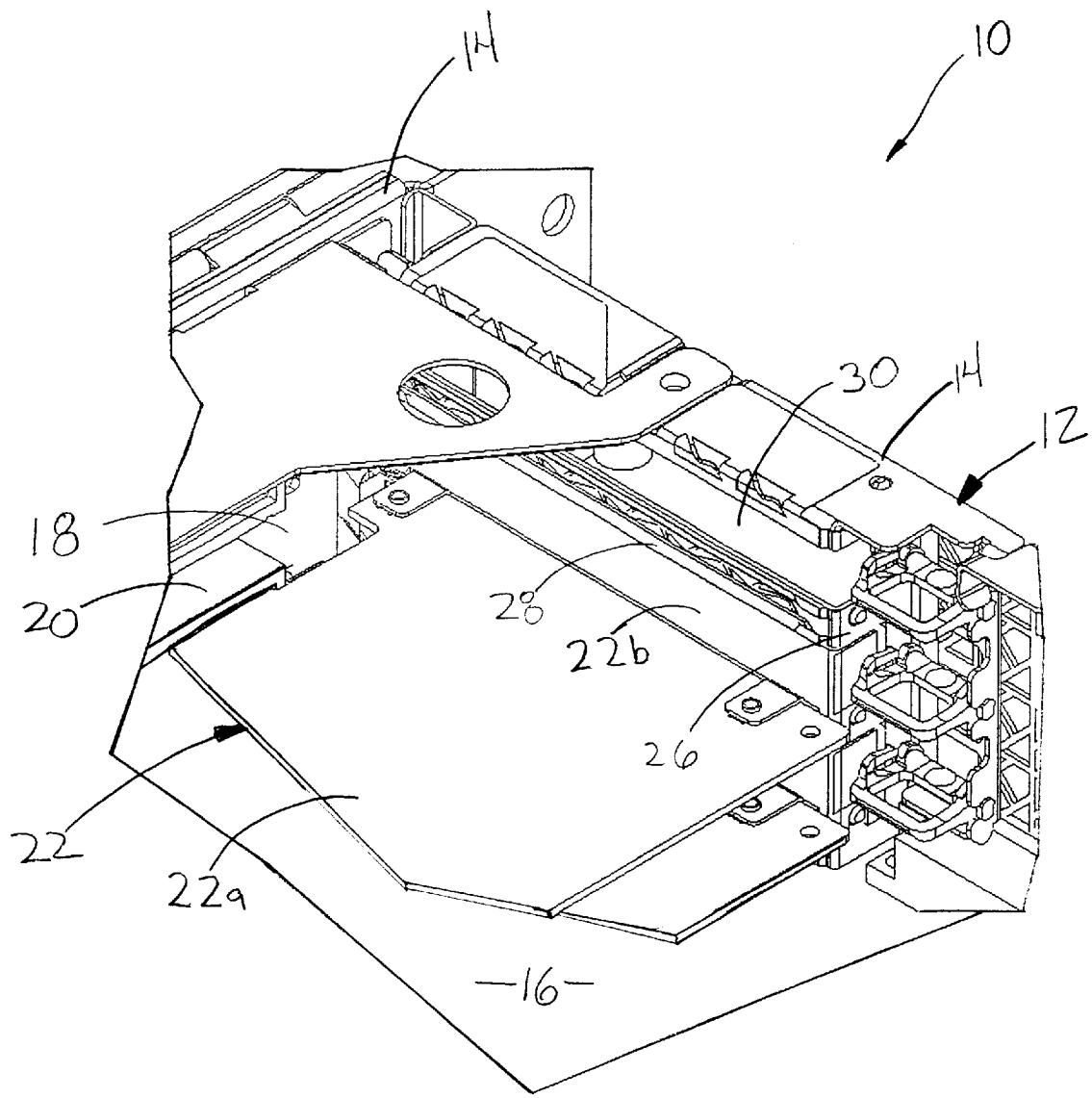
FIG. 2 is an enlarged view illustrating an expansion device region of the electronic apparatus of FIG. 1.

An embodiment of an electronic apparatus 10 is illustrated in FIGS. 1 and 2. A computer illustrates one example of the electronic apparatus 10. The electronic apparatus 10 includes a chassis 12 having a plurality of walls 14 and a base 16. The walls 14 extend in respective directions generally perpendicular to the base 16.

A printed circuit substrate 18, such as a motherboard or a combination of a motherboard and a daughter card, is attached to the chassis 12. One or more connectors 20 are mounted on and electrically connected to the printed circuit substrate 18. An expansion device 22 is electrically connected to one of the connectors 20. More than one expansion device 22 may be mounted in the chassis 12. The expansion device 22 includes a printed circuit substrate 22a and an end plate 22b, FIG. 2. The expansion device 22 is mounted on the chassis 12 with the end plate 22b positioned adjacent to one of the walls 14 of the chassis 12. An EMI shielding device such as a grounding frame 26, FIG. 2, is positioned between the chassis 12 and the end plate 22b for providing a reliable ground path between the chassis 12 and the expansion device 22.

Figure 3:
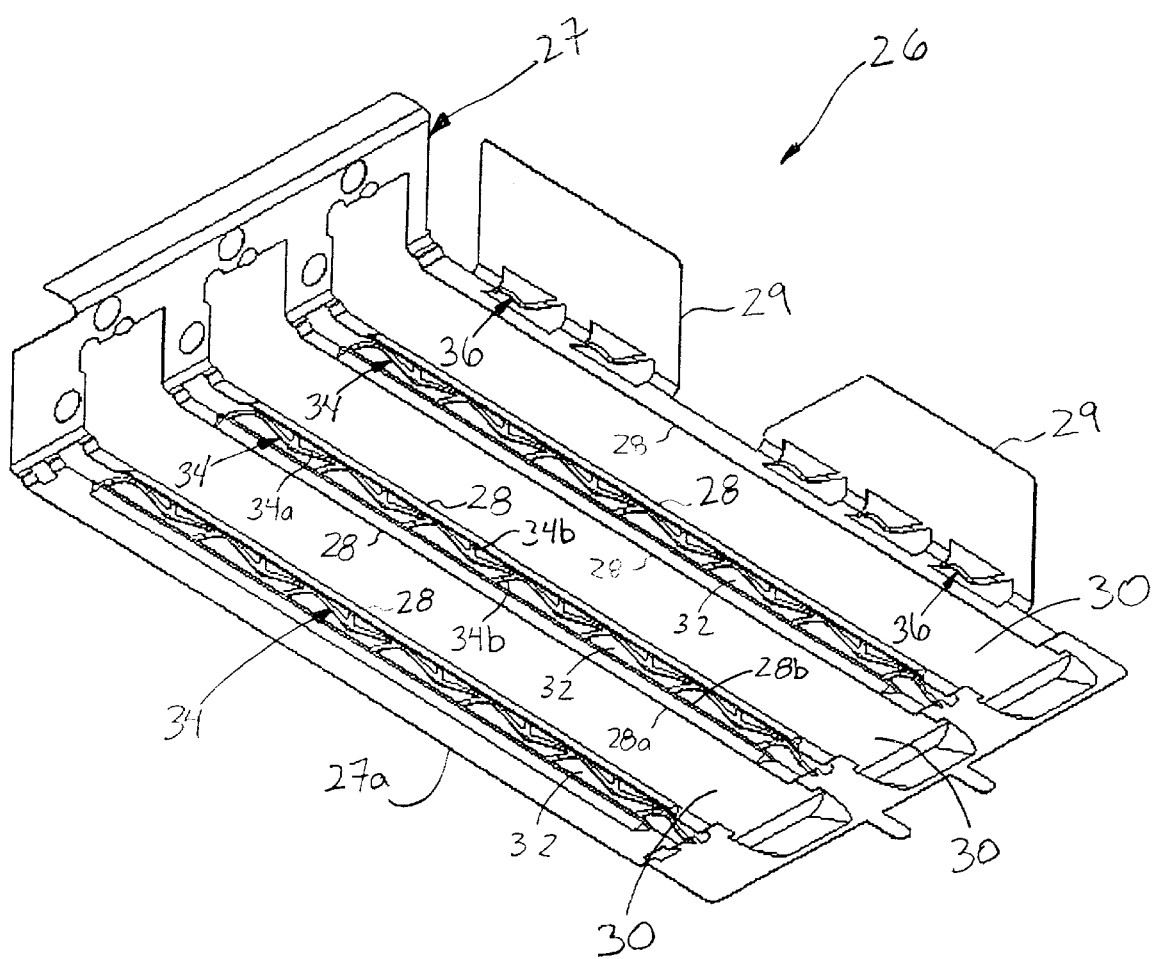
FIG. 3 is a perspective view illustrating an embodiment of an EMI shielding device.

The grounding frame 26, FIG. 3, includes a shielding body 27, a plurality of spaced apart contact members 28 attached to the shielding body 27, and a plurality of flanges 29 attached to the shielding body 27. The flanges 29 extend in a direction generally perpendicular to the contact members 28. Each one of the contact members 28 includes a first edge 28a and a second edge 28b. The first edge 28a of each contact member 28 partially defines a respective access opening 30 in the shielding body 27. The first edge 28a of each contact member 28 preferably has a length substantially the same as a corresponding longitudinal edge of the end plate 22b, FIG. 2, of the expansion device 22. The second edge 28b of each contact member 28 partially defines a respective spring member window 32 in the shielding body 27.

Figure 4A:
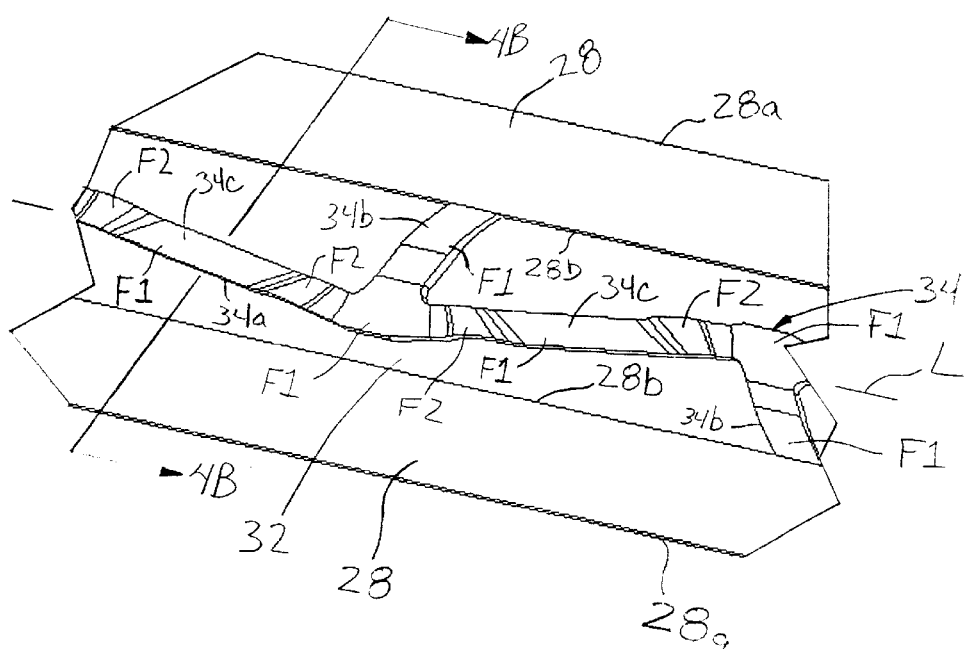
FIG. 4A is an enlarged fragmentary view illustrating an embodiment of a main sprig member.

A main spring member 34, FIGS. 3 and 4A, extends longitudinally adjacent to each spring member window 32. Preferably, each main spring member 34 is positioned between the adjacent contact members 28. Each main spring member 34 includes an elongated beam 34a offset from each adjacent contact member 28. A plurality of spring fingers 34b interconnect the respective elongated beam 34a and at least one of the adjacent contact members 28. Each spring finger 34b is attached at a first end to the respective contact member 28 and at a second end to the respective elongated beam 34a. Each spring finger 34b is skewed with respect to the attached contact member 28.

The elongated beam 34a, FIG. 4A, includes a plurality of segments 34c. Each one of the segments 34c is skewed with respect to each adjacent one of the segments 34c. One of the spring fingers 34b is attached to the elongated beam 34a at an intersection point between two adjacent segments 34c. Each segment 34c has at least one of the spring fingers 34b attached thereto and each one of the spring fingers 34b is skewed with respect to each attached segment 34c.

A key aspect of the grounding frame 26 disclosed herein is that the main spring member 34 is formed from a spring member material using two different types of forming techniques. Free forming and force forming techniques are used to fabricate the main spring member 34 from the spring member material. The main spring member 34 includes a plurality of force formed portions F1 and free formed portions F2, FIG. 4A. The force formed portions F1 are formed in portions of a stamping die that captures and forcibly compresses portions of the spring member material, thereby imparting residual stresses therein. By compressing the force formed portions F1, the rigidity of the spring member material of the force formed portions F1 is significantly increased. The free formed portions F2 are not constrained by the stamping die during forming, thereby allowing them to be freely contoured without imparting residual stresses.

The result of using free forming and force forming techniques is that the free formed portions F2 act as rotational joints, allowing the force formed portions F1 to rotate in a substantially unconstrained manner. In combination with the rigidity of the force formed portions F1, the free formed portions F2 result in the elongated beam 34a exhibiting minimal lateral deflection relative to a longitudinal axis L, FIG. 4A, that is defined by each spring member window 32. Because the force formed portions Flare free to rotate in an unconstrained manner, the resulting flexural characteristics of the main spring member 34 are enhanced considerably relative to the inherent flexural properties of the spring member material.

Figure 4B:
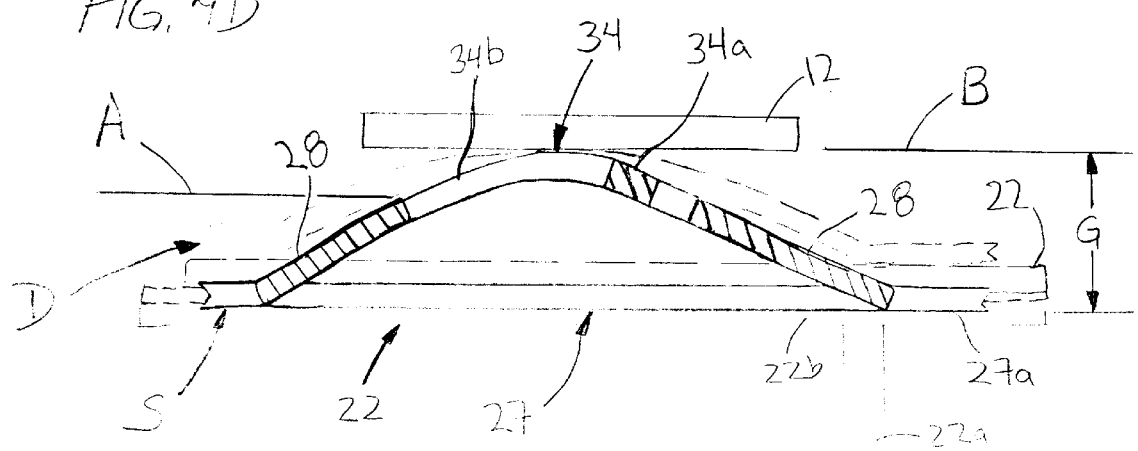
FIG. 4B is cross sectional view taken along the line 4B—4B in FIG. 4A.

As illustrated in FIG. 4B, the first end of each spring finger 34b is positioned adjacent to a first reference plane A and the second end of each spring finger is positioned adjacent to a second reference plane B. The first reference plane A is spaced apart from and extends generally parallel to the second reference plane B. The first and the second reference planes A, B extend generally parallel to a main surface 27a of the shielding body 27. One or more of the contact members 28 are skewed with respect to the first and the second reference planes A, B. The elongated beam 34a and the spring fingers 34b have a generally arcuate cross sectional profile.

The main surface 27a of the shielding body 27, FIG. 4B, is movable between a static position S and a displaced position D. The main spring member 34 is moved to the displaced position D when the corresponding expansion device 22 is mounted on the chassis 12.

Figure 5A:
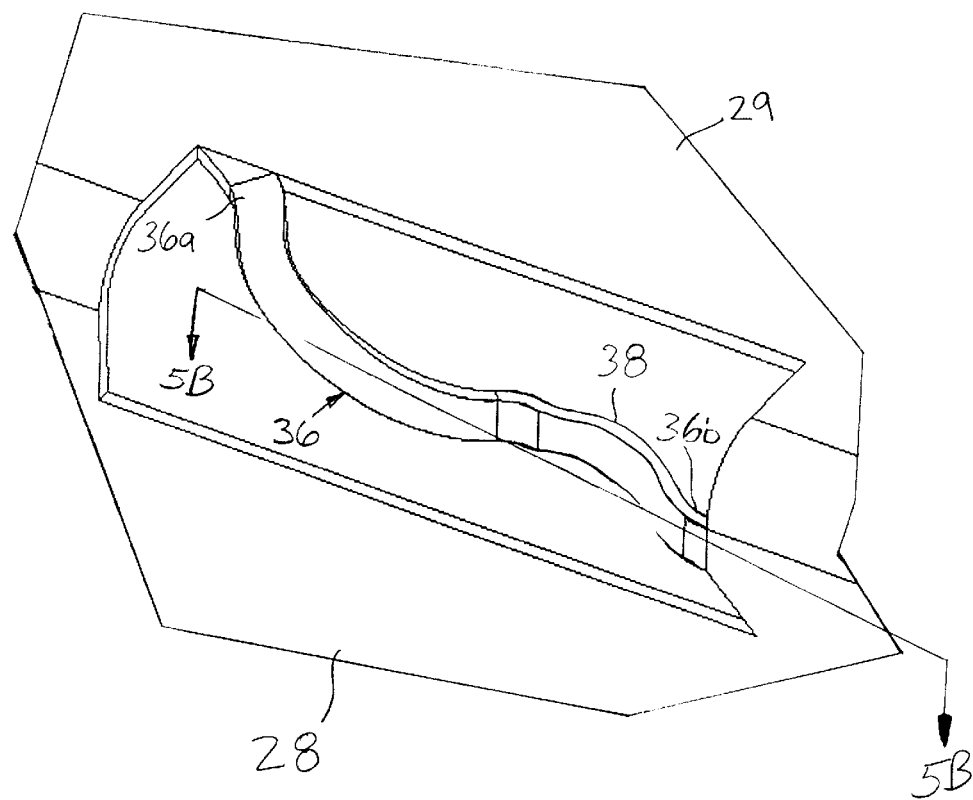
FIG. 5A is a fragmentary view illustrating an embodiment of a corner spring member
Figure 5B:
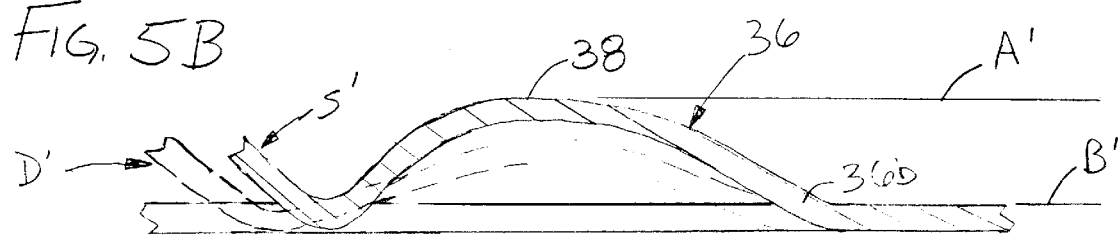
FIG. 5B is a cross sectional view taken along the line 5B—5B in FIG. 5A.

At least one corner spring member 36, FIGS. 3 and 5A, is attached between each flange 29 and the adjacent contact member 28. Each corner spring member 36 is attached at a first end 36a, FIG. 5A, to the flange 29 and at a second end 36b to the adjacent contact member 28. Each corner spring member 36 includes a chassis engaging portion 38. As illustrated in FIG. 5B, the chassis engaging portion 38 is positioned substantially adjacent to the first reference plane A' and the second end 36b of the corner spring member 36 is positioned adjacent to the second reference plane B'.

The corner spring member 36 is moved from a static position S' to a displaced position D' when the corresponding expansion device 22 is mounted on the chassis 12. The corner spring member 36 is preferably formed using free forming and force forming techniques, as discussed above in reference to the main spring member 34.

When the grounding frame 26 is mounted in the chassis 12, each access opening 30, FIGS. 2 and 3, is aligned with a mating access opening extending through the corresponding wall 14 of the chassis 12. Each access opening 30 and mating access opening in the chassis 12 provides access to an end portion of the expansion device 22 for manipulating the controls of the expansion device 22, attaching cables to the expansion device 22, or otherwise interacting with the expansion device 22 when it is mounted in the chassis 12.

Due to manufacturing tolerances and capabilities, there is typically a thin design gap G, FIG. 4B, between the chassis 12 and the end plate 22b of the expansion device 22. The design gap G is typically around 0.015 inches. The grounding frame 26 is made of a thin material and is designed to fit into this gap. The contact members 28 act as resilient shields that provide a contact interface between the chassis 12 and expansion device 22, establishing a reliable ground path therebetween.

When an expansion device 22 is mounted in the chassis 12, the contact members 28 provide a substantially continuous electrical contact along corresponding edge portions of the respective access opening of the chassis 12. The electrical contact reduces the potential for electromagnetic emissions to breach the chassis 12 through the corresponding access opening of the chassis 12. In this manner, the grounding frame 26 disclosed herein provides a reliable ground path between the chassis 12 and the one or more expansion devices 22. Furthermore, the configuration of the contact members 28 make the grounding frame 26 less prone to being damaged during installation or removal of the expansion device 22.

The chassis 12 is typically made of a conductive material such as sheet metal. The grounding frame 26 disclosed herein is preferably made from commercially available sheet metal such as double reduced electrolytic tin-plated grade 8, commonly referred to as DR8. The contact members 28, flanges 29, main spring members 34 and corner spring members 36 may be formed integrally with the shielding body 27. The grounding frame 26 may be made using conventional manufacturing processes such as sheet metal forming and progressive die stamping techniques.

Another key aspect of the grounding frame 26 disclosed herein is its ability to provide the required shielding functionality even though the grounding frame 26 is made from a material, such as DR8, that exhibits less than preferred flexural properties. Typical materials for shielding devices such as the grounding frame 26 include beryllium copper alloys and phosphor bronze alloys. A material such as beryllium copper exhibits a yield strength as much as about 50% more than DR8 and an elastic modulus as much as about one-third less than DR8. Accordingly, a material such as beryllium copper has superior flexural properties for the grounding frame 26.

However, in cost-sensitive applications such as entry level computer systems, the cost of beryllium copper is a limiting factor that may preclude its use for components such as the grounding frame 26. Beryllium copper costs as much as about 23 times more than DR8, on a per pound basis. Accordingly, significant cost savings are achieved by fabricating the grounding frame 26 from a low-cost material such as DR8 rather than a high performance material such as beryllium copper.

Figure 6:
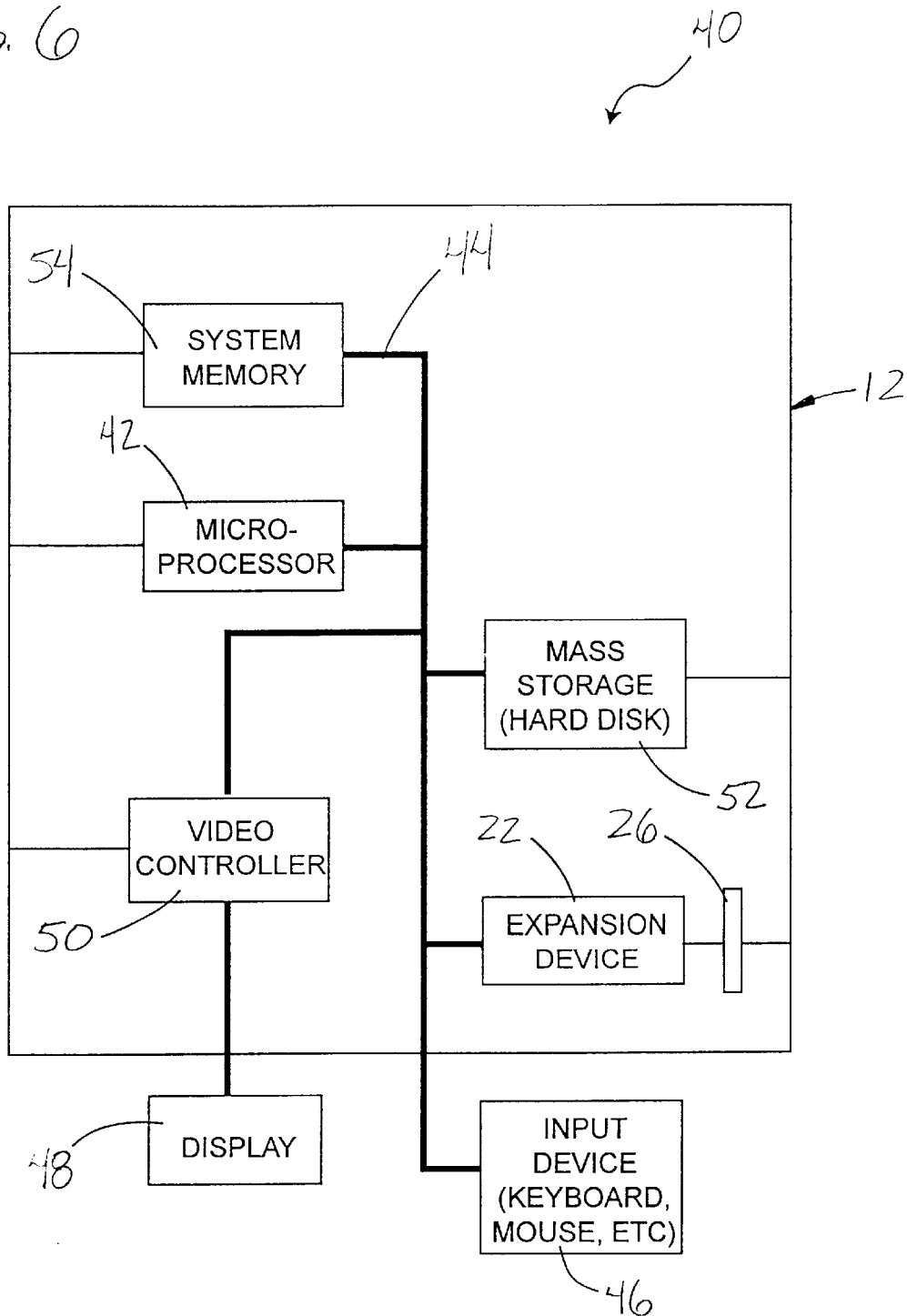
FIG. 6 is a block diagram illustrating an embodiment of a computer system having a chassis with an EMI shielding device and an expansion device mounted thereon.

An embodiment of a computer system 40 is illustrated in FIG. 6. The computer system 40 includes at least one microprocessor 42. The microprocessor 42 is connected to a bus 44. The bus 44 serves as a connection between the microprocessor 42 and other components of the computer system 40. An input device 46 is coupled to the microprocessor 42 to provide input to the microprocessor 42. Examples of input devices include keyboards, touchscreens, and pointing devices such as a mouse, a trackball and a trackpad. The computer system 40 may also include a display 48, which is coupled to the microprocessor 42 typically by a video controller 50. Programs and data are stored on a mass storage device 52 which is coupled to the microprocessor 42. Mass storage devices include components such as hard disks, optical disks, magneto-optical drives, floppy drives, and the like. A system memory 54 provides the microprocessor 42 with fast storage to facilitate execution of computer programs by the microprocessor 42. It should be understood that other busses and intermediate circuits can be employed between the components described above and microprocessor 42 to facilitate interconnection between the components and the microprocessor 42.

Still referring to FIG. 6, the expansion device 22, discussed above, is coupled to the microprocessor 42 through the bus 44. Various components of the computer system 40, including the expansion device 42, are mounted in an enclosure such as the chassis 12, discussed above. The expansion device 22 is electrically coupled to the chassis 12 by the grounding frame 26. Other components such as the microprocessor 42, the system memory 54 and the video controller 50 may also be grounded to the chassis 12.

As a result, one embodiment provides an apparatus for reducing electromagnetic emissions including a shielding body having a pair of spaced apart contact members attached to the shielding body. A main spring member is attached to at least one of the contact members. The main spring member includes an elongated beam offset from the contact members and a plurality of spring fingers interconnecting the beam and at least one of the contact members.

Another embodiment provides a computer system including a chassis having a microprocessor mounted thereon. A system memory is coupled to provide storage to facilitate execution of computer programs by the microprocessor. An input is coupled to provide input to the microprocessor and a display is coupled to the microprocessor by a video controller. A mass storage is coupled to the microprocessor. A shielding body is mounted on the chassis. A pair of spaced apart contact members are attached to the shielding body. A main spring member is attached to at least one of the contact members. The main spring member includes an elongated beam offset from the contact members and a plurality of spring fingers interconnecting the beam and at least one of the contact members.

A further embodiment provides an EMI shielding device including a shielding body having a plurality of spaced apart contact members attached to the shielding body. Each one of the contact members includes a first edge and a second edge. The first edge of each contact member partially defines an access opening in the shielding body and the second edge of each contact member partially defines a spring member window in the shielding body. A main spring member is positioned adjacent to each spring member window. Each main spring member includes an elongated beam offset from adjacent ones of the contact members and a plurality of spring fingers interconnecting the respective beam and each adjacent contact member. Each one of the spring fingers is attached to the second edge of the respective contact members and the elongated beam of each main spring member is substantially centered in the respective spring member window.

As it can be seen, the embodiments presented herein provide several advantages. An EMI shielding device may be made from a relatively low-cost material that exhibits less than preferred flexural properties. Through the use of free forming and force forming techniques, the physical configuration of the spring members results in the spring members exhibiting resiliency substantially greater than the inherent resiliency of the spring member material. The webbed configuration resulting from the construction of the spring members and the adjacent contact members eliminates discontinuities and obstructions such that the edge portions of an expansion device do not engage and damage the contact members or portions of the spring members during insertion and removal of the expansion device. Smaller EMI aperture gaps are maintained while still retaining resilient contact with ground points on the expansion device. The shielding device provides a substantially continuous EMI gasket along the edges of the expansion device, improving the reliability of the ground between the chassis and the expansion device such that electromagnetic emissions are reduced.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An apparatus for reducing electromagnetic emissions, comprising:
   a shielding body;
   a pair of spaced apart contact members attached to the shielding body;
   a main spring member attached to at least one of the contact members, the main spring member including an elongated beam offset from the contact members, the elongated beam having a generally arcuate cross-sectional profile; and
   a plurality of spring fingers interconnecting the beam and at least one of the contact members.

2. The apparatus of claim 1 wherein each one of the spring fingers is attached at a first end thereof to a respective one of the contact members and at a second end thereof to the elongated beam.

3. The apparatus of claim 2 wherein the first end of each spring finger is positioned adjacent to a first reference plane and the second end of each spring finger is positioned adjacent to a second reference plane, the first reference plane being spaced apart from and extending generally parallel to the second reference plane.

4. The apparatus of claim 3 wherein the first and the second reference planes extend generally parallel to a main surface of the shielding body, the main surface having an access opening formed therethrough.

5. The apparatus of claim 4 wherein each contact member is skewed with respect to the first and the second reference planes.

6. The apparatus of claim 1 wherein each spring finger is skewed with respect to each one of the contact members.

7. The apparatus of claim 1 wherein the elongated beam includes a plurality of segments each one of the segments being skewed with respect to each adjacent one of the segments.

8. The apparatus of claim 7 wherein each segment includes free formed portions and force formed portions.

9. The apparatus of claim 8 wherein each segment includes a first end and a second end, the first and the second ends including free formed portions and a force formed portion being disposed therebetween.

10. The apparatus of claim 7 wherein each segment of the beam has at least one of the spring fingers attached thereto.

11. The apparatus of claim 10 wherein each one of the spring fingers is skewed with respect to the attached one of the segments.

12. The apparatus of claim 1 wherein the main spring member is positioned between the contact members.

13. The apparatus of claim 1 wherein an access opening is at least partially defined by the spaced apart contact members.

14. The apparatus of claim 1, further comprising:
   a chassis; and
   an expansion device mounted on the chassis, the shielding body positioned between the chassis and the expansion device, at least one of the contact members engaging the expansion device and the main spring member being engaged against the chassis.

15. The apparatus of claim 14 wherein the main spring member is movable between a static position and a displaced position, the main spring member being in the displaced position when the expansion device is mounted on the chassis.

16. The apparatus of claim 1 wherein the shielding body, contact members and main spring member are integrally formed.

17. The apparatus of claim 1, further comprising:
   a flange attached to one of the contact members, the flange extending in a direction generally perpendicular to the attached contact member; and
   a corner spring member attached to the flange and to the attached contact member.

18. The apparatus of claim 17 wherein the corner spring member is attached at a first end thereof to the flange and at a second end thereof to the attached contact member.

19. The apparatus of claim 18 wherein the corner spring member includes a chassis engaging portion, the chassis engaging surface positioned adjacent to a first reference plane and the second end of the corner spring member positioned adjacent to a second reference plane, the first reference plane being spaced apart from and extending generally parallel to the second reference plane.

20. The apparatus of claim 1 wherein the elongated beam includes force formed portions and free formed portions, each one of the spring fingers being attached to the elongated beam adjacent to a free formed portion.

21. A computer system, comprising:
   a chassis;

a microprocessor mounted on the chassis;

a system memory coupled to provide storage to facilitate execution of computer programs by the microprocessor;

an input coupled to provide input to the microprocessor;

a display coupled to the microprocessor by a video controller;

a mass storage coupled to the microprocessor;

a shielding body mounted on the chassis;

a pair of spaced apart contact members attached to the shielding body;

a main spring member attached to at least one of the contact members, the main spring member including an elongated beam offset from the contact members;

a plurality of spring fingers interconnecting the beam and at least one of the contact members; and the elongated beam including force formed portions and free formed portions, each one of the spring fingers being attached to the elongated beam adjacent to a free formed portion.

22. The computer system of claim 21, further comprising:

an expansion device mounted on the chassis and electrically connected to the microprocessor, the shielding body positioned between the chassis and the expansion device, wherein at least one of the contact members is engaged with the expansion device and wherein the main spring member is engaged with the chassis.

23. An EMI shielding device, comprising:

a shielding body;

a plurality of spaced apart contact members attached to the shielding body, each one of the contact members including a first edge and a second edge, the first edge of each contact member partially defining an access opening in the shielding body and the second edge of each contact member partially defining a spring member window in the shielding body;

a main spring member positioned adjacent to each spring member window, each main spring member including an elongated beam offset from adjacent ones of the contact members;

a plurality of spring fingers interconnecting the respective beam and each adjacent contact member, each one of the spring fingers being attached to the second edge of the respective contact members and the elongated beam of each main spring member being substantially centered in the respective spring member window; and each elongated beam including force formed portions and free formed portions, each one of the spring fingers being attached to the respective elongated beam adjacent to a free formed portion.

\* \* \* \* \*